(12) United States Patent
Kajiwara et al.

(10) Patent No.: US 12,745,576 B2
(45) Date of Patent: Sep. 22, 2026

(54) SEMICONDUCTOR DEVICE, INSPECTION APPARATUS OF SEMICONDUCTOR DEVICE, AND METHOD FOR INSPECTING SEMICONDUCTOR DEVICE

(71) Applicant: KABUSHIKI KAISHA TOSHIBA, Tokyo (JP)

(72) Inventors: Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 196 days.

(21) Appl. No.: 18/676,114

(22) Filed: May 28, 2024

(65) Prior Publication Data

US 2024/0312780 A1 Sep. 19, 2024

Related U.S. Application Data

(62) Division of application No. 17/141,461, filed on Jan. 5, 2021, now abandoned.

(30) Foreign Application Priority Data

Apr. 15, 2020 (JP) ................................ 2020-072779

(51) Int. Cl.
*H10P 14/20* (2026.01)
*H10D 62/40* (2025.01)
*H10D 62/85* (2025.01)
*H10D 64/00* (2025.01)

(52) U.S. Cl.
CPC ......... *H10P 14/3216* (2026.01); *H10D 62/40* (2025.01); *H10D 62/8503* (2025.01); *H10D 64/00* (2025.01)

(58) Field of Classification Search
None
See application file for complete search history.

(56) References Cited

U.S. PATENT DOCUMENTS

2013/0187627 A1* 7/2013 Imada ...................... G05F 3/08 323/311
2014/0335666 A1 11/2014 Koehler et al.
2019/0221503 A1 7/2019 Nakamura et al.
2020/0027976 A1 1/2020 Mukai et al.
(Continued)

FOREIGN PATENT DOCUMENTS

JP 09-222454 A 8/1997
JP 9-266226 A 10/1997
JP 11-150128 A 6/1999
(Continued)

*Primary Examiner* — Jack S Chen
(74) *Attorney, Agent, or Firm* — Oblon, McClelland, Maier & Neustadt, L.L.P.

(57) ABSTRACT

According to one embodiment, a semiconductor device includes a first transistor, and a first mounting member. The first transistor includes a nitride semiconductor layer and includes a first element electrode, a second element electrode, and a third element electrode. The first mounting member includes a first frame electrode, a plurality of first frame connection members electrically connecting the first element electrode and the first frame electrode, a first pad electrode, and a first pad connection member electrically connecting the first element electrode and the first pad electrode.

11 Claims, 12 Drawing Sheets

(56) References Cited

U.S. PATENT DOCUMENTS

2021/0327711 A1* 10/2021 Kajiwara ........... G01R 31/2621

FOREIGN PATENT DOCUMENTS

| | | | |
|---|---|---|---|
| JP | 2010-16103 | A | 1/2010 |
| JP | 2013-153027 | A | 8/2013 |
| JP | 2013-219306 | A | 10/2013 |
| JP | 2016-46923 | A | 4/2016 |
| JP | 2020-17577 | A | 1/2020 |
| WO | WO 2018/061711 | A1 | 4/2018 |

* cited by examiner

110
A1
A2
52
D2
52W
13
12
B1
53
B2
10
18
53W
58
11
C1
50
C2
51W
61W
61
51
D1
Y
Z
X 52
58F
50
58
Z
Y
X 10
53W
13
58F
12
10s
53
18
50
Z
58
Y
X 61
51
58F
50
Z
58
Y
X 51W
11
58F
12
52W
10
51
52
50
Z
58
X
Y
10s
18

SEMICONDUCTOR DEVICE, INSPECTION APPARATUS OF SEMICONDUCTOR DEVICE, AND METHOD FOR INSPECTING SEMICONDUCTOR DEVICE

CROSS-REFERENCE TO RELATED APPLICATIONS

This application is a divisional of and claims benefit under 35 U.S.C. § 120 to U.S. application Ser. No. 17/141,461 filed Jan. 5, 2021, which is based upon and claims the benefit of priority under 35 U.S.C. § 119 to Japanese Patent Application No. 2020-072779, filed Apr. 15, 2020, the entire contents of each of which are incorporated by reference in their entirety.

FIELD

Embodiments of the invention generally relate to a semiconductor device, an inspection apparatus of a semiconductor device, and a method for inspecting a semiconductor device.

BACKGROUND

It is desirable to improve the quality of a semiconductor device.

DETAILED DESCRIPTION

Figures 1A, 1B, 1C, 1D, 1E:
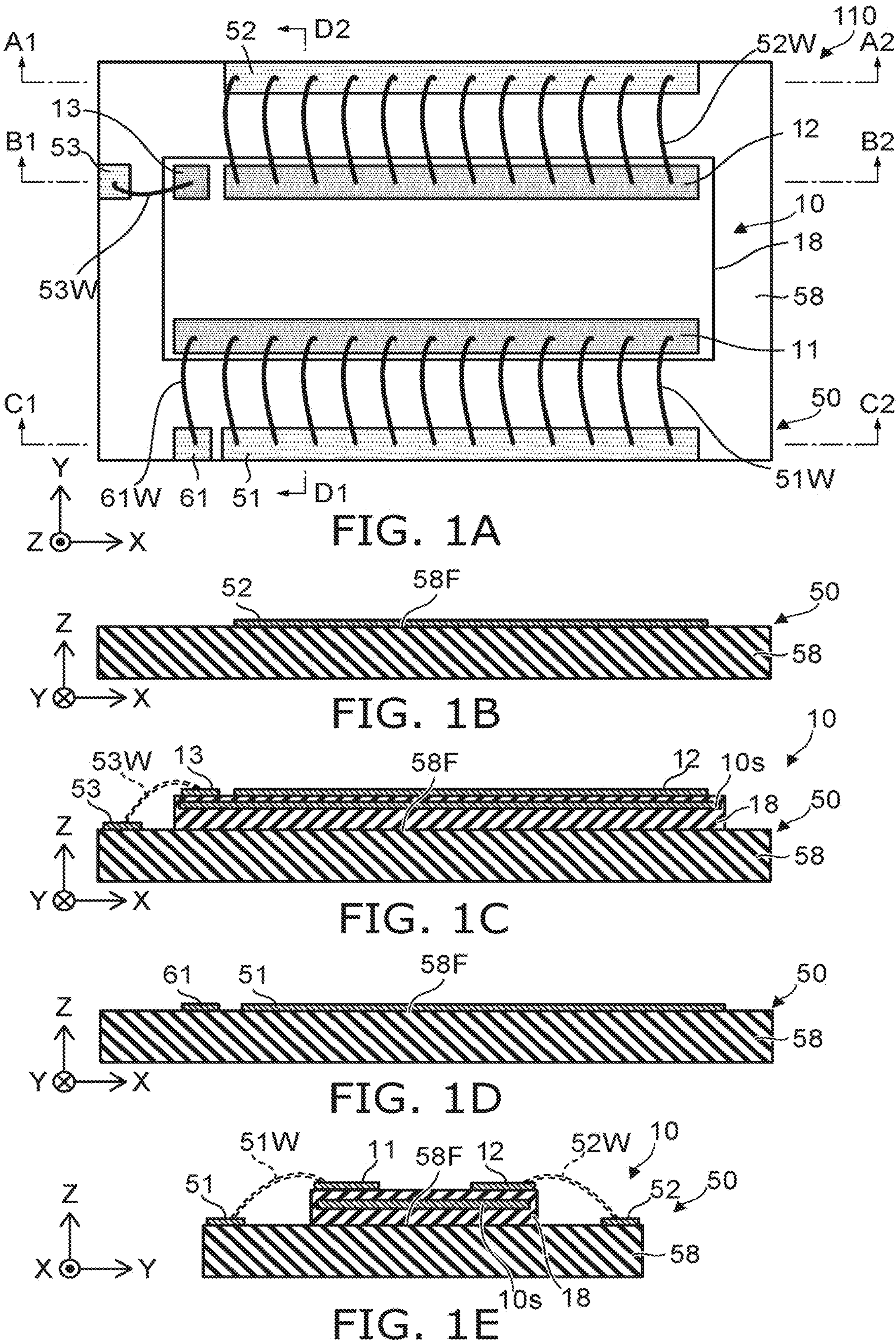
FIGS. 1A to 1E are schematic views illustrating a semiconductor device according to a first embodiment.

According to one embodiment, a semiconductor device includes a first transistor, and a first mounting member. The first transistor includes a nitride semiconductor layer and includes a first element electrode, a second element electrode, and a third element electrode. The first mounting member includes a first frame electrode, a plurality of first frame connection members electrically connecting the first element electrode and the first frame electrode, a first pad electrode, and a first pad connection member electrically connecting the first element electrode and the first pad electrode.

According to one embodiment, a semiconductor device includes a first transistor, and a first mounting member. The first transistor includes a nitride semiconductor layer and includes a first element electrode, a second element electrode, and a third element electrode. The first mounting member includes a plurality of first frame electrodes, a plurality of first frame connection members electrically connecting the first element electrode and one of the plurality of first frame electrodes, and an other plurality of first frame connection members electrically connecting the first element electrode and an other one of the plurality of first frame electrodes.

According to one embodiment, an inspection apparatus of a semiconductor device includes a first probe, a second probe, a third probe, a fourth probe, and a controller electrically connected to the first, second, third, and fourth probes. The controller is configured to inspect the semiconductor device. The semiconductor device includes a first transistor including a nitride semiconductor layer and including a first element electrode, a second element electrode, and a third element electrode, and a first mounting member. The first mounting member includes a first frame electrode, a plurality of first frame connection members electrically connecting the first element electrode and the first frame electrode, a second frame electrode, a second frame connection member electrically connecting the second element electrode and the second frame electrode, a first pad electrode, and a first pad connection member electrically connecting the first element electrode and the first pad electrode. In a first inspection state, the first probe is electrically connected to a first portion of the first frame electrode. The second probe is electrically connected to the second frame electrode. The third probe is electrically connected to the first pad electrode. The fourth probe is electrically connected to a second portion of the first frame electrode. The controller is configured to inspect at least a portion of the plurality of first frame connection members by detecting a potential difference between the third probe and the fourth probe when a current is supplied between the first probe and the second probe in the first inspection state.

According to one embodiment, an inspection apparatus of a semiconductor device includes a first probe, a second probe, and a controller electrically connected to the first and second probes and configured to inspect the semiconductor device. The semiconductor device includes a first transistor including a nitride semiconductor layer and including a first element electrode, a second element electrode, and a third element electrode, and a first mounting member. The first mounting member includes a plurality of first frame electrodes, a plurality of first frame connection members electrically connecting the first element electrode and one of the plurality of first frame electrodes, and an other plurality of first frame connection members electrically connecting the first element electrode and an other one of the plurality of first frame electrodes. In a first inspection state, the first probe is electrically connected to the one of the plurality of first frame electrodes, and the second probe is electrically connected to the other one of the plurality of first frame electrodes. The controller is configured to inspect at least a portion of the plurality of first frame connection members by detecting a current flowing between the first probe and the second probe in the first inspection state.

According to one embodiment, a method for inspecting a semiconductor device is disclosed. The semiconductor device includes a first transistor including a nitride semiconductor layer and including a first element electrode, a second element electrode, and a third element electrode, and a first mounting member. The first mounting member includes a first frame electrode, a plurality of first frame connection members electrically connecting the first element electrode and the first frame electrode, a second frame electrode, a second frame connection member electrically connecting the second element electrode and the second frame electrode, a first pad electrode, and a first pad connection member electrically connecting the first element electrode and the first pad electrode. The method can include inspecting at least a portion of the plurality of first frame connection members by detecting a current flowing between a first probe and a second probe in a first inspection state. The first inspection state includes the first probe being electrically connected to a first portion of the first frame electrode, the second probe being electrically connected to the second frame electrode, a third probe being electrically connected to the first pad electrode, and a fourth probe being electrically connected to a second portion of the first frame electrode.

According to one embodiment, a method for inspecting a semiconductor device is disclosed. The semiconductor device includes a first transistor including a nitride semiconductor layer and including a first element electrode, a second element electrode, and a third element electrode, and a first mounting member. The first mounting member includes a plurality of first frame electrodes, a plurality of first frame connection members electrically connecting the first element electrode and one of the plurality of first frame electrodes, and an other plurality of first frame connection members electrically connecting the first element electrode and an other one of the plurality of first frame electrodes. The method can include inspecting at least a portion of the plurality of first frame connection members by detecting a current flowing between the first probe and the second probe in a first inspection state. The first inspection state includes the first probe being electrically connected to the one of the plurality of first frame electrodes, and the second probe being electrically connected to the other one of the plurality of first frame electrodes.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1E are schematic views illustrating a semiconductor device according to a first embodiment. FIG. 1A is a plan view. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A. FIG. 1E is a line D1-D2 cross-sectional view of FIG. 1A.

As shown in FIG. 1A, the semiconductor device 110 according to the embodiment includes a first transistor 10 and a first mounting member 50.

The first transistor 10 includes a first element electrode 11, a second element electrode 12, and a third element electrode 13. As shown in FIGS. 1C and 1E, the first transistor 10 includes a nitride semiconductor layer 10*s*. The nitride semiconductor layer 10*s* includes a nitride semiconductor. For example, the nitride semiconductor layer 10*s* includes GaN.

As shown in FIG. 1A, the first mounting member 50 includes a first frame electrode 51, multiple first frame connection members 51W, a first pad electrode 61, and a first pad connection member 61W. The multiple first frame connection members 51W electrically connect the first element electrode 11 and the first frame electrode 51. The first pad connection member 61W electrically connects the first element electrode 11 and the first pad electrode 61. The multiple first frame connection members 51W and the first pad connection member 61W are, for example, wires.

In the example as shown in FIGS. 1B to 1E, the first mounting member 50 includes a mounting substrate 58. The mounting substrate 58 includes a first substrate surface 58F. The first substrate surface 58F faces the first transistor 10. The first frame electrode 51, the first pad electrode 61, and the first transistor 10 are located on the first substrate surface 58F. The first substrate surface 58F faces the first frame electrode 51 and the first pad electrode 61. The first substrate surface 58F is, for example, the upper surface.

The direction from the mounting substrate 58 toward the first frame electrode 51 shown in FIG. 1D is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction. The first substrate surface 58F is along the X-Y plane.

As shown in FIG. 1E, the position of the nitride semiconductor layer 10*s* in the first direction (the Z-axis direction) is between the position of the first substrate surface 58F in the first direction and the position of the first element electrode 11 in the first direction. As shown in FIGS. 1C and 1E, the position of the nitride semiconductor layer 10*s* in the first direction (the Z-axis direction) is between the position of the first substrate surface 58F in the first direction and the position of the second element electrode 12 in the first direction. As shown in FIG. 1C, the position of the nitride semiconductor layer 10*s* in the first direction (the Z-axis direction) is between the position of the first substrate surface 58F in the first direction and the position of the third element electrode 13 in the first direction.

For example, the first transistor 10 includes an element member 18. The nitride semiconductor layer 10*s* is on at least a portion of the element member 18. For example, the first element electrode 11, the second element electrode 12, and the third element electrode 13 are located on the element member 18.

In the example as shown in FIG. 1A, the first mounting member 50 includes a second frame electrode 52 and a second frame connection member 52W. Multiple second frame connection members 52W are provided in the example. The multiple second frame connection members 52W electrically connect the second element electrode 12 and the second frame electrode 52.

In the example as shown in FIG. 1A, the first mounting member 50 includes a third frame electrode 53 and a third frame connection member 53W. The third frame connection member 53W electrically connects the third element electrode 13 and the third frame electrode 53.

The first element electrode 11 is, for example, a drain electrode of the first transistor 10. The second element electrode 12 is, for example, a source electrode of the first transistor 10. The third element electrode 13 is, for example, a gate electrode of the first transistor 10.

In the example as shown in FIG. 1A, the direction from the third element electrode 13 toward the second element electrode 12 is along the X-axis direction. The direction from the first element electrode 11 toward the second element electrode 12 is along the Y-axis direction.

By providing the first pad electrode 61 in the semiconductor device 110 as described below, the state of the multiple first frame connection members 51W can be inspected with high accuracy. A semiconductor device can be provided thereby in which the quality can be improved.

Figure 2:
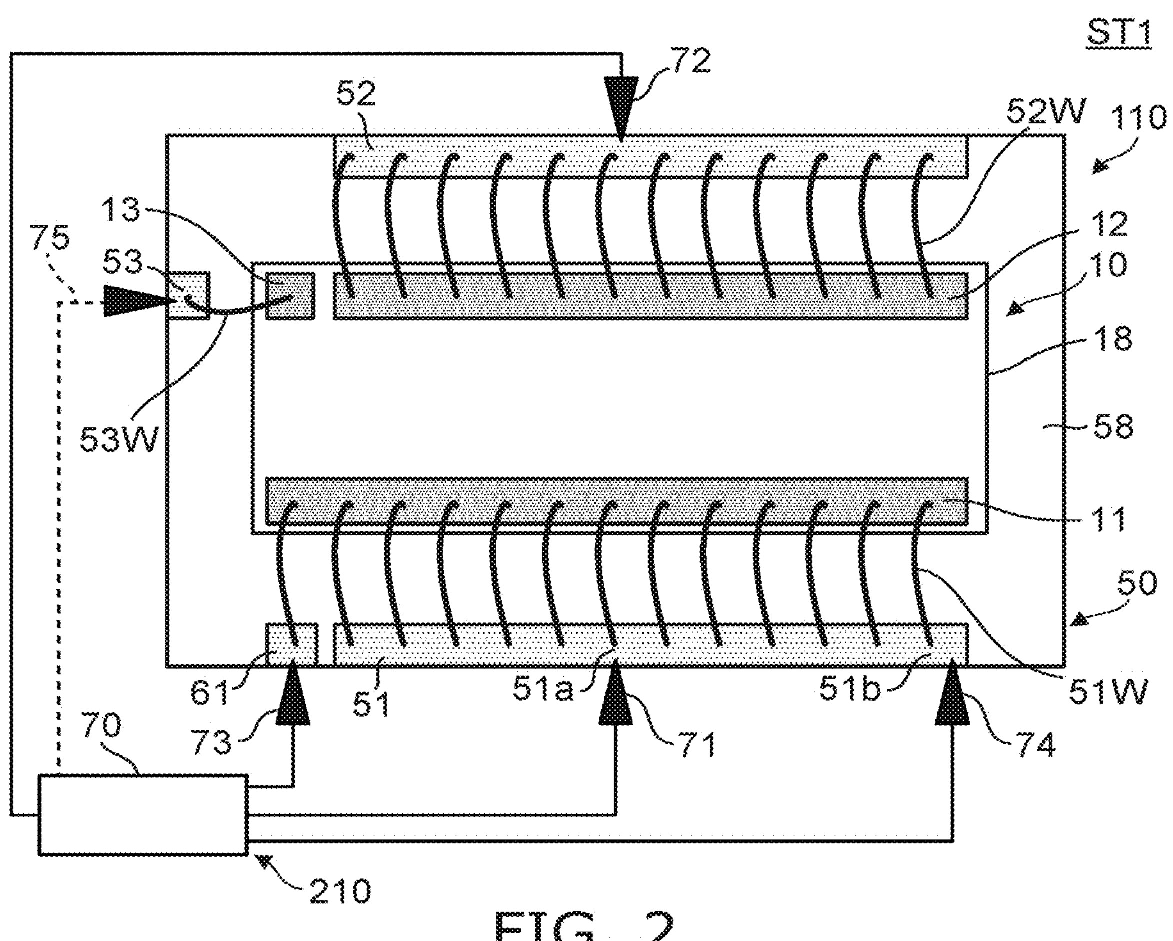
FIG. 2 is a schematic plan view illustrating an inspection state of the semiconductor device according to the first embodiment.

FIG. 2 is a schematic plan view illustrating an inspection state of the semiconductor device according to the first embodiment.

As shown in FIG. 2, an inspection apparatus 210 of the semiconductor device includes a first probe 71, a second probe 72, a third probe 73, a fourth probe 74, and a controller 70. The controller 70 is electrically connected to the first, second, third, and fourth probes 71, 72, 73, and 74. The controller 70 is configured to inspect the semiconductor device 110.

As shown in FIG. 2, the controller 70 inspects the semiconductor device 110 in a first inspection state ST1. In the first inspection state ST1, the first probe 71 is electrically connected to a first portion 51*a* of the first frame electrode 51, the second probe 72 is electrically connected to the second frame electrode 52, the third probe 73 is electrically connected to the first pad electrode 61, and the fourth probe 74 is electrically connected to a second portion 51*b* of the first frame electrode 51. For example, these electrical connections may be performed by contact between the probe and the electrode. As described below, another pad that is electrically connected to one electrode may be provided, and one probe may be electrically connected to the one electrode by electrically connecting the one probe to the other pad. For example, the first portion 51*a* of the first frame electrode 51 is between the first pad electrode 61 and the second portion 51*b* of the first frame electrode 51.

The controller 70 is configured to inspect at least a portion of the multiple first frame connection members 51W in such a first inspection state ST1 by detecting a potential difference between the third probe 73 and the fourth probe 74 when a current is supplied between the first probe 71 and the second probe 72.

Figure 3:
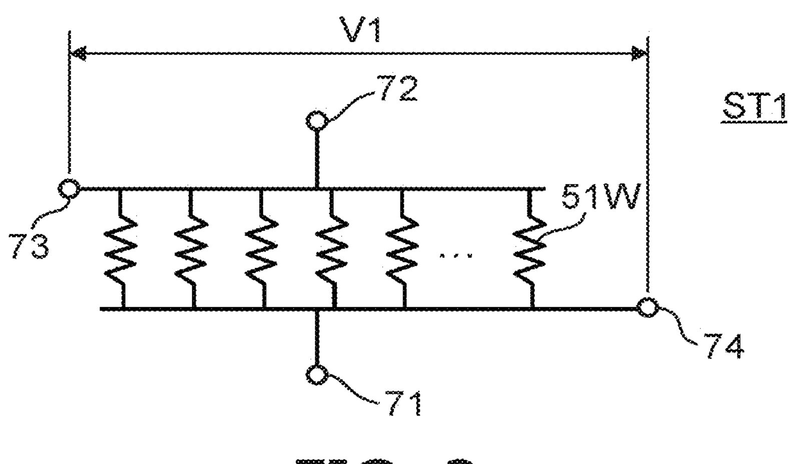
FIG. 3 is an equivalent circuit illustrating the inspection state of the semiconductor device according to the first embodiment.

FIG. 3 is an equivalent circuit illustrating the inspection state of the semiconductor device according to the first embodiment.

As shown in FIG. 3, a current is supplied between the first probe 71 and the second probe 72 in the first inspection state ST1. The resistance of one of the multiple first frame connection members 51W is taken as a resistance R1. The number of the multiple first frame connection members 51W is taken as a number N1. In such a case, a resistance Rx that is measured by a potential difference V1 generated between the third probe 73 and the fourth probe 74 is R1/N1. A defect of the multiple first frame connection members 51W can be detected when the measured resistance Rx is outside a determined value range.

In such a measurement, the measured resistance Rx is dependent on the multiple first frame connection members 51W regardless of other resistances (e.g., the resistance inside the first transistor 10, etc.). Accordingly, the state of the multiple first frame connection members 51W to be detected can be detected with high accuracy.

Figure 4:
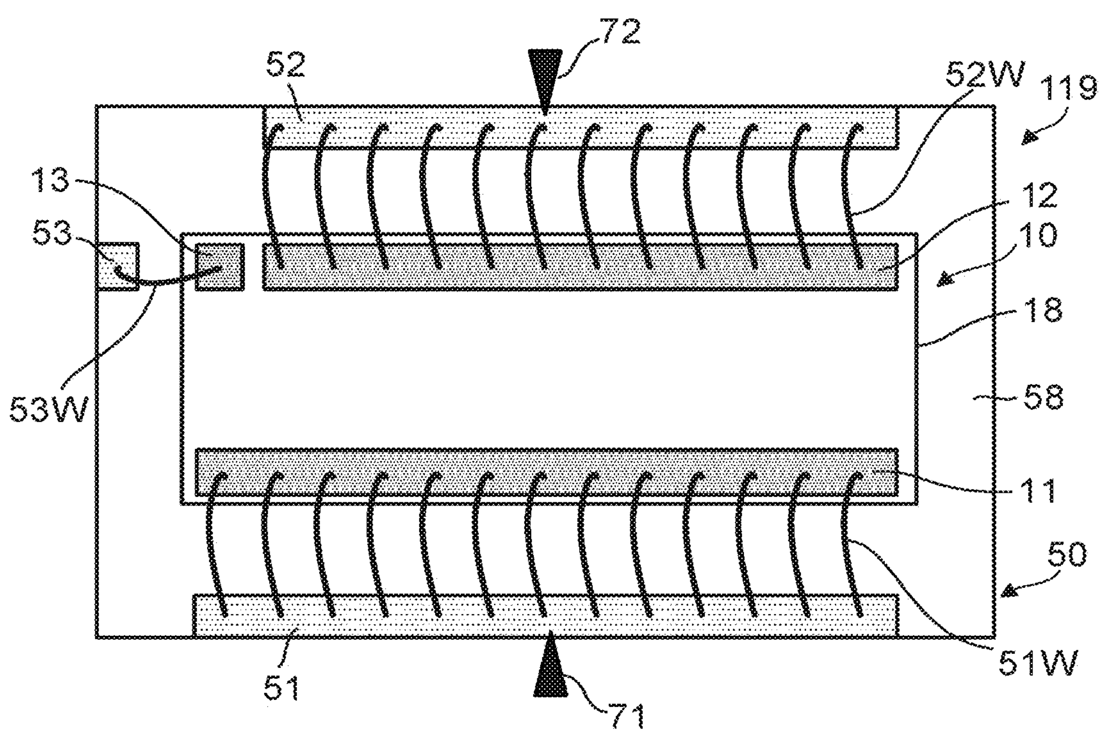
FIG. 4 is a schematic plan view illustrating a semiconductor device and an inspection state according to a reference example.

FIG. 4 is a schematic plan view illustrating a semiconductor device and an inspection state according to a reference example.

As shown in FIG. 4, the first pad electrode 61 and the first pad connection member 61W are not provided in the semiconductor device 119 of the reference example. In the inspection of the semiconductor device 119, the first probe 71 is electrically connected to the first frame electrode 51, and the second probe 72 is electrically connected to the second frame electrode 52. For example, a current is supplied between the first probe 71 and the second probe 72, and a potential difference between the first probe 71 and the second probe 72 is detected. The inspection is performed based on the detected potential difference.

Figure 5:
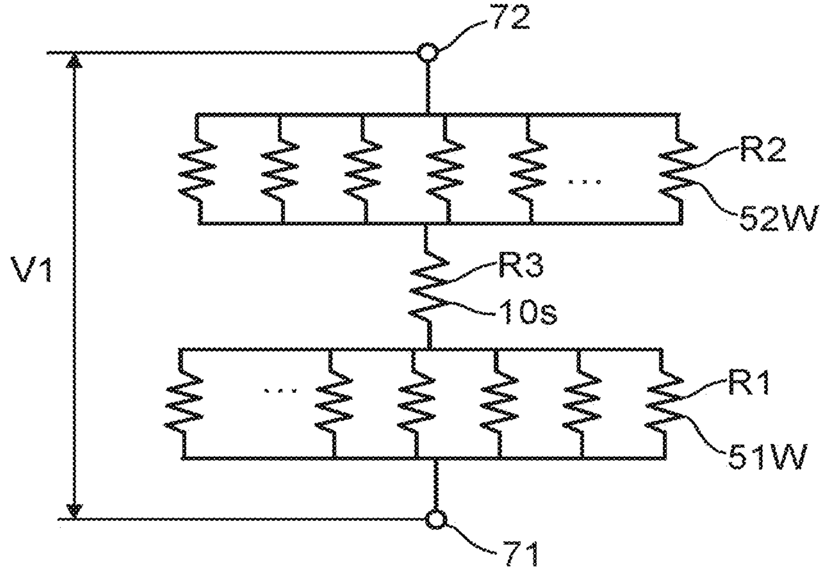
FIG. 5 is an equivalent circuit illustrating the inspection state of the semiconductor device according to the reference example.

FIG. 5 is an equivalent circuit illustrating the inspection state of the semiconductor device according to the reference example.

In the semiconductor device 119, the resistance of one of the multiple first frame connection members 51W is taken as the resistance R1, and the number of the multiple first frame connection members 51W is taken as the number N1. The resistance of one of the multiple second frame connection members 52W is taken as a resistance R2, and the number of the multiple second frame connection members 52W is taken as a number N2. The resistance inside the first transistor 10 is taken as a resistance R3. For example, the resistance R3 is based on the resistance of the nitride semiconductor layer 10*s*, etc. In such a reference example, the resistance Rx that is measured using the potential difference generated between the first probe 71 and the second probe 72 is R1/N1+R2/N2+R3. In the reference example, the resistance Rx is dependent not only on the resistance of the multiple first frame connection members 51W to be detected but also on other resistances (e.g., the resistance R2, the resistance R3, etc.). Accordingly, in the reference example, it is difficult to detect, with high accuracy, the state of the multiple first frame connection members 51W to be detected.

Conversely, in the embodiment, the measured resistance Rx is dependent on the multiple first frame connection members 51W regardless of other resistances (e.g., the resistance R2, the resistance R3, etc.). In the embodiment, the state of the multiple first frame connection members 51W to be detected can be detected with high accuracy.

For example, the resistance R1 of one of the multiple first frame connection members 51W is taken to be 32 mΩ. The number N1 of the multiple first frame connection members 51W is taken to be 40. The resistance R2 of one of the multiple second frame connection members 52W is taken to be 64 mΩ. The number N2 of the multiple second frame connection members 52W is taken to be 40. The resistance R3 is taken to be 44 mΩ. In such a case, the occurrence of a connection defect in one first frame connection member 51W is as follows.

In the semiconductor device 119 of the reference example, the resistance Rx that is detected when there are no defects is 32 mΩ/40+64 mΩ/40+44 mΩ, i.e., 46.4 mΩ. The resistance Rx that is detected when a connection defect has occurred in one first frame connection member 51W is 32 mΩ/39+64 mΩ/40+44 mΩ, i.e., 46.4205 mΩ. The difference between these resistances is 0.04% of the resistance Rx detected when there are no defects.

On the other hand, in the semiconductor device 110 according to the embodiment, the resistance Rx that is detected when there are no defects is 32 mΩ/40, i.e., 0.8 mΩ. The resistance Rx that is detected when a connection defect has occurred in one first frame connection member 51W is 32 mΩ/39, i.e., 0.821 mΩ. The difference between these resistances is 2.6% of the resistance Rx detected when there are no defects.

Thus, in the embodiment, one defect greatly affects the resistance Rx. According to the embodiment, the state of the multiple first frame connection members 51W to be detected can be detected with high accuracy. The quality is more easily improved because the inspection has high accuracy. High productivity is easily obtained. According to the embodiment, a semiconductor device can be provided in which the quality can be improved.

For example, in a transistor that includes a nitride semiconductor such as GaN, etc., the resistance inside the transistor is exceedingly low. Therefore, it is desirable to reduce the resistance of the connection members such as the wires, etc., of such a transistor. Therefore, for example, the electrical connection is performed using multiple connection members (wires, etc.). When multiple connection members are used, for example, the desired characteristics are not obtained when a connection defect occurs in one of the multiple connection members. For example, when a connection defect occurs in one of the multiple connection members, a nonuniform distribution occurs in the current flowing through the element electrodes, and the reliability of the element degrades. Degradation over time of the element over long-term use is easily caused. For a transistor that includes a nitride semiconductor, it is desirable to detect, with high accuracy, the connection state of the multiple connection members to be detected. In the embodiment, the connection state of the multiple connection members (e.g., the multiple first frame connection members 51W) can be inspected with high accuracy. A semiconductor device can be provided in which the quality can be improved thereby.

In the embodiment, the controller 70 may include a fifth probe 75 (referring to FIG. 2). The fifth probe 75 is electrically connected to the third frame electrode 53. For example, the electrical connection may be performed by contact between the probe and the electrode. For example, the controller 70 may perform the inspection of the multiple first frame connection members 51W in a state in which a voltage is applied to the third frame electrode 53.

Figures 6A, 6B, 6C, 6D, 6E:
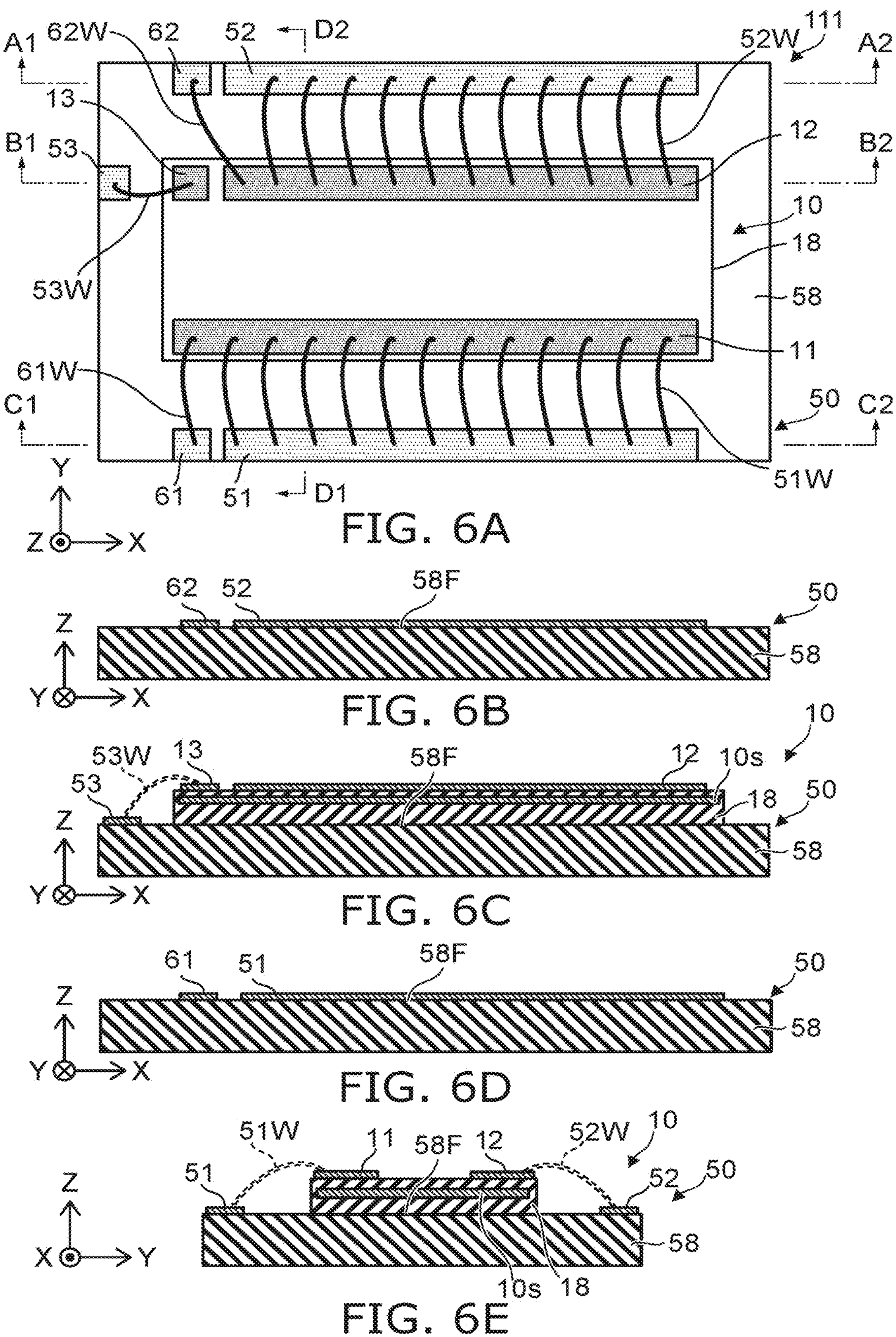
FIGS. 6A to 6E are schematic views illustrating a semiconductor device according to the first embodiment.

FIGS. 6A to 6E are schematic views illustrating a semiconductor device according to the first embodiment. FIG. 6A is a plan view. FIG. 6B is a line A1-A2 cross-sectional view of FIG. 6A. FIG. 6C is a line B1-B2 cross-sectional view of FIG. 6A. FIG. 6D is a line C1-C2 cross-sectional view of FIG. 6A. FIG. 6E is a line D1-D2 cross-sectional view of FIG. 6A.

As shown in FIG. 6A, the semiconductor device 111 according to the embodiment also includes the first transistor 10 and the first mounting member 50. In the semiconductor device 111, the first mounting member 50 includes a second pad electrode 62 and a second pad connection member 62W. Otherwise, the configuration of the semiconductor device 111 is similar to that of the semiconductor device 110.

The second pad connection member 62W electrically connects the second element electrode 12 and the second pad electrode 62. As shown in FIG. 6B, the second pad electrode 62 is located on the first substrate surface 58F of the mounting substrate 58. The second pad connection member 62W is, for example, a wire.

Figure 7:
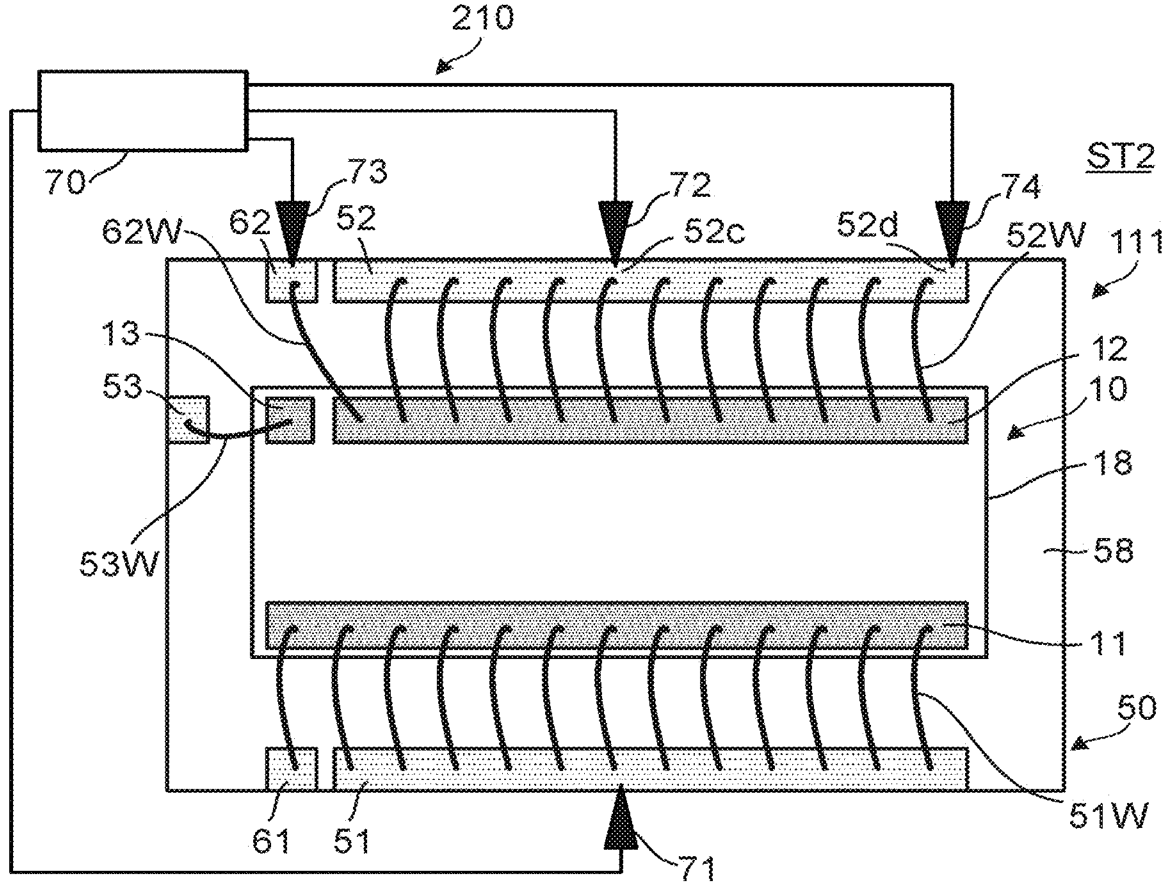
FIG. 7 is a schematic plan view illustrating an inspection state of the semiconductor device according to the first embodiment.
Figures 8A, 8B, 8C, 8D, 8E:
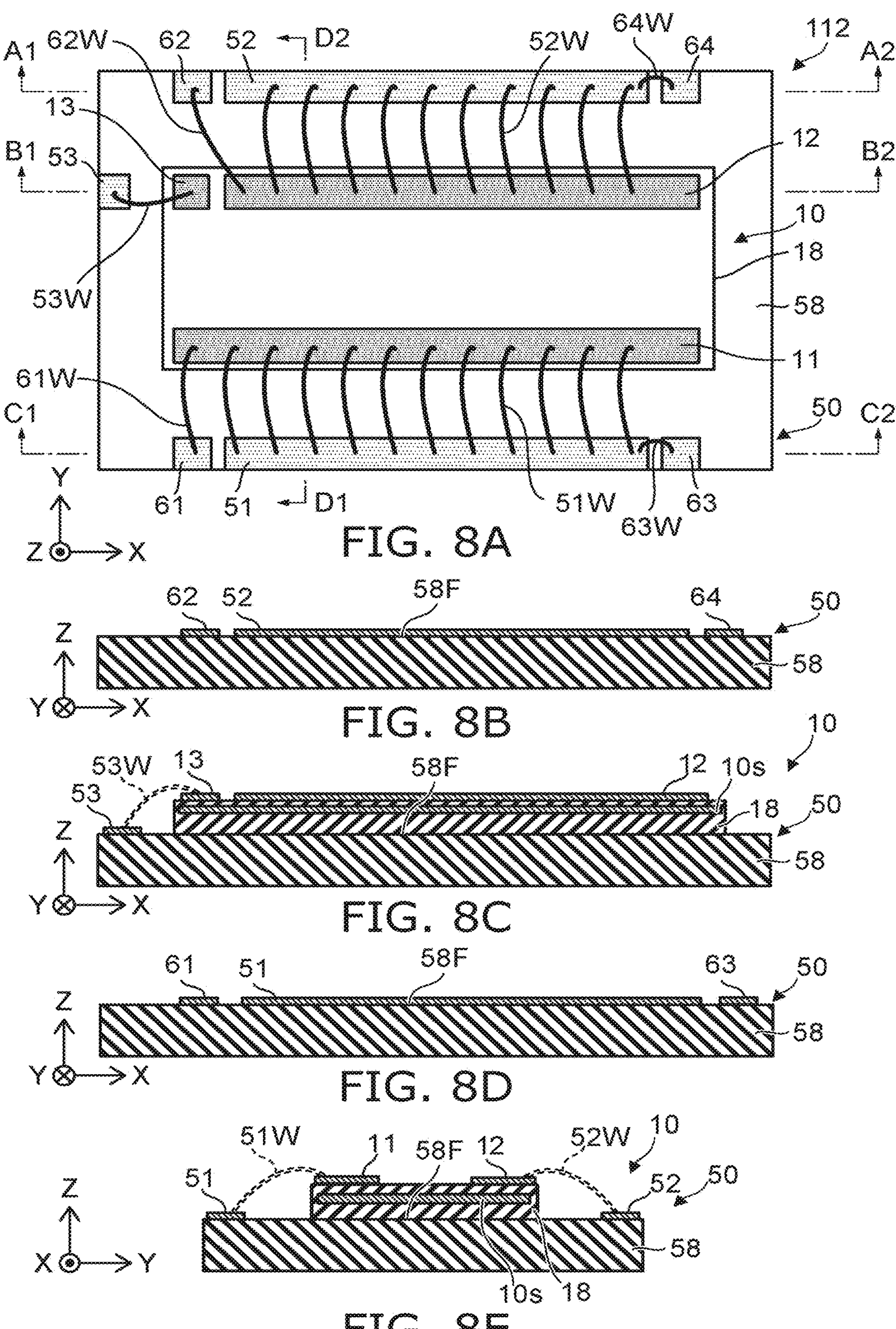
FIGS. 8A to 8E are schematic plan views illustrating a semiconductor device according to the first embodiment.

FIG. 7 is a schematic plan view illustrating an inspection state of the semiconductor device according to the first embodiment.

As shown in FIG. 7, the inspection apparatus 210 of the semiconductor device includes the first probe 71, the second probe 72, the third probe 73, the fourth probe 74, and the controller 70.

As shown in FIG. 7, the controller 70 inspects the semiconductor device 111 in a second inspection state ST2. In the second inspection state ST2, the first probe 71 is electrically connected to the first frame electrode 51, the second probe 72 is electrically connected to a third portion **52*c* of the second frame electrode 52, the third probe 73 is electrically connected to the second pad electrode 62, and the fourth probe 74 is electrically connected to a fourth portion 52*d* of the second frame electrode 52. For example, these electrical connections may be performed by contact between the probe and the electrode. For example, the third portion 52*c* of the second frame electrode 52 is between the second pad electrode 62 and the fourth portion 52*d* of the second frame electrode 52**.

The controller 70 is configured to inspect at least a portion of the multiple second frame connection members 52W in such a second inspection state ST2 by detecting a potential difference between the third probe 73 and the fourth probe 74 when a current is supplied between the first probe 71 and the second probe 72.

In the semiconductor device 111, the state of the multiple second frame connection members 52W to be detected can be detected with high accuracy. A semiconductor device can be provided in which the quality can be improved.

In the embodiment, the controller 70 may include the fifth probe 75 (referring to FIG. 2). The fifth probe 75 is electrically connected to the third frame electrode 53. The controller 70 may perform the inspection of the multiple second frame connection members 52W in a state in which a voltage is applied to the third frame electrode 53.

FIGS. 8A to 8E are schematic plan views illustrating a semiconductor device according to the first embodiment.

As shown in FIGS. 8A to 8E, the semiconductor device 112 according to the embodiment also includes the first transistor 10 and the first mounting member 50. In the semiconductor device 112, the first mounting member 50 includes a third pad electrode 63 and a third pad connection member 63W. In the example, the first mounting member 50 further includes a fourth pad electrode 64 and a fourth pad connection member 64W. Otherwise, the configuration of the semiconductor device 112 is similar to that of the semiconductor device 111.

The third pad connection member 63W electrically connects the third pad electrode 63 and the first frame electrode 51. The fourth pad connection member 64W electrically connects the fourth pad electrode 64 and the second frame electrode 52. For example, at least a portion of the first frame electrode 51 is between the first pad electrode 61 and the third pad electrode 63. For example, at least a portion of the second frame electrode 52 is between the second pad electrode 62 and the fourth pad electrode 64. The third pad connection member 63W and the fourth pad connection member 64W are, for example, wires.

In the semiconductor device 112, for example, in the first inspection state ST1, the first probe 71 is electrically connected to the first frame electrode 51, the second probe 72 is electrically connected to the second frame electrode 52, the third probe 73 is electrically connected to the first pad electrode 61, and the fourth probe 74 is electrically connected to the third pad electrode 63. The controller 70 is configured to inspect at least a portion of the multiple first frame connection members 51W in such a first inspection state ST1 by detecting a potential difference between the third probe 73 and the fourth probe 74 when a current is supplied between the first probe 71 and the second probe 72.

In the semiconductor device 112, for example, in the second inspection state ST2, the first probe 71 is electrically connected to the first frame electrode 51, the second probe 72 is electrically connected to the second frame electrode 52, the third probe 73 is electrically connected to the second pad electrode 62, and the fourth probe 74 is electrically connected to the fourth pad electrode 64. The controller 70 is configured to inspect at least a portion of the multiple second frame connection members 52W in such a second inspection state ST2 by detecting a potential difference between the third probe 73 and the fourth probe 74 when a current is supplied between the first probe 71 and the second probe 72.

In the semiconductor device 112 as well, the state to be detected can be detected with high accuracy. A semiconductor device can be provided in which the quality can be improved.

Figure 9:
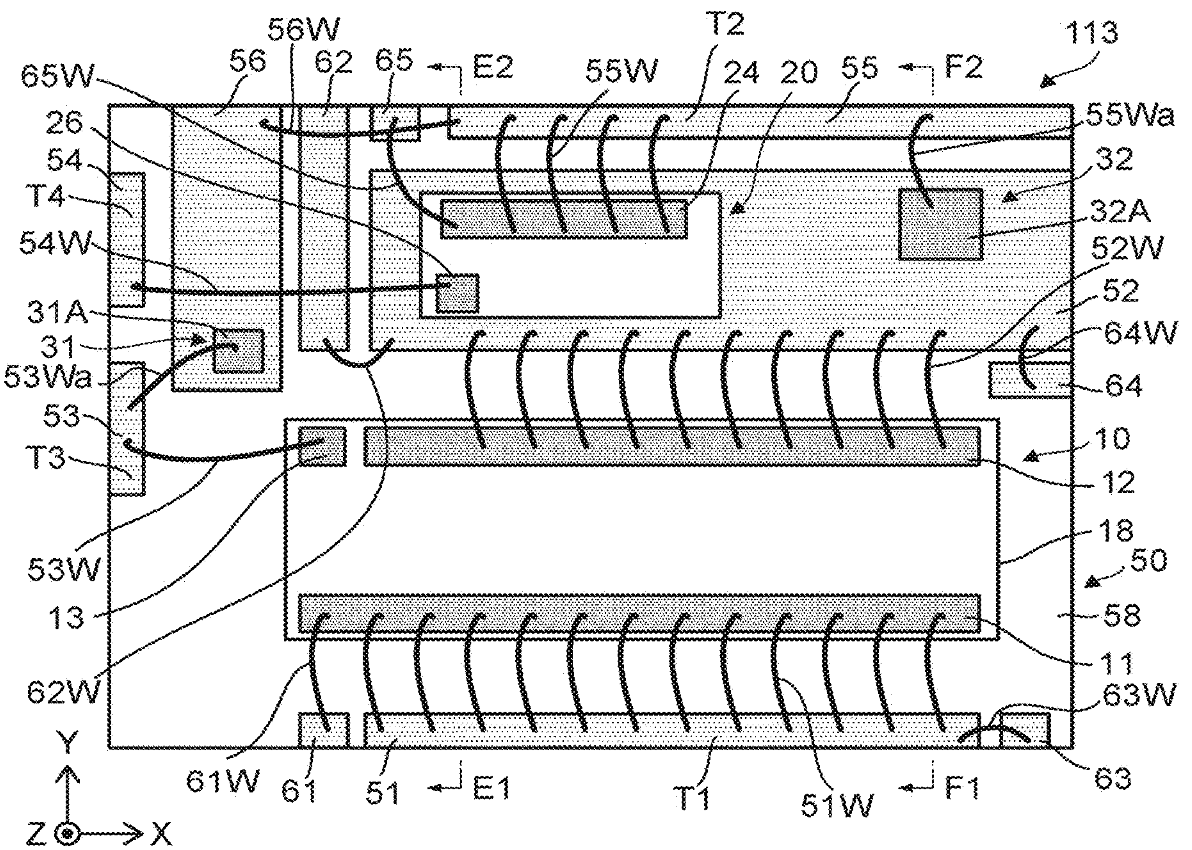
FIG. 9 is a schematic plan view illustrating a semiconductor device according to the first embodiment.

FIG. 9 is a schematic plan view illustrating a semiconductor device according to the first embodiment.

Figure 10A:
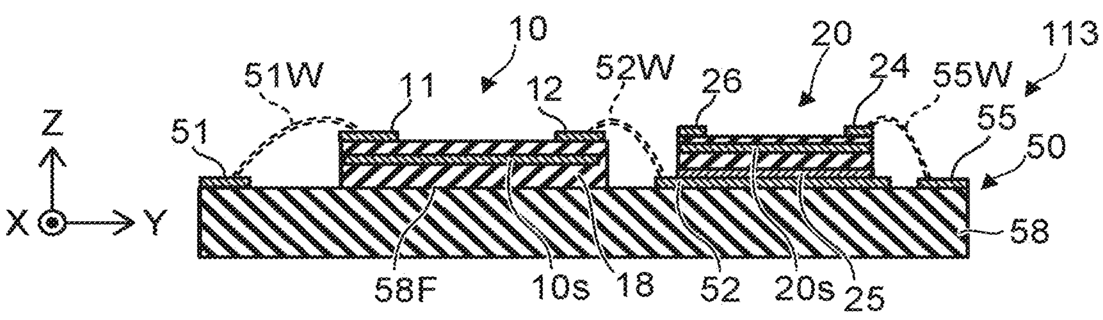
FIGS. 10A and 10B are schematic cross-sectional views illustrating the semiconductor device according to the first embodiment.
Figure 10B:
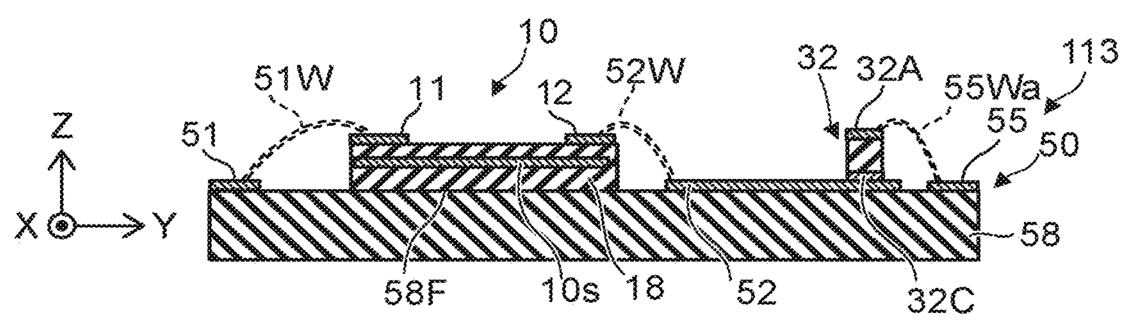

FIGS. 10A and 10B are schematic cross-sectional views illustrating the semiconductor device according to the first embodiment.

Figure 11:
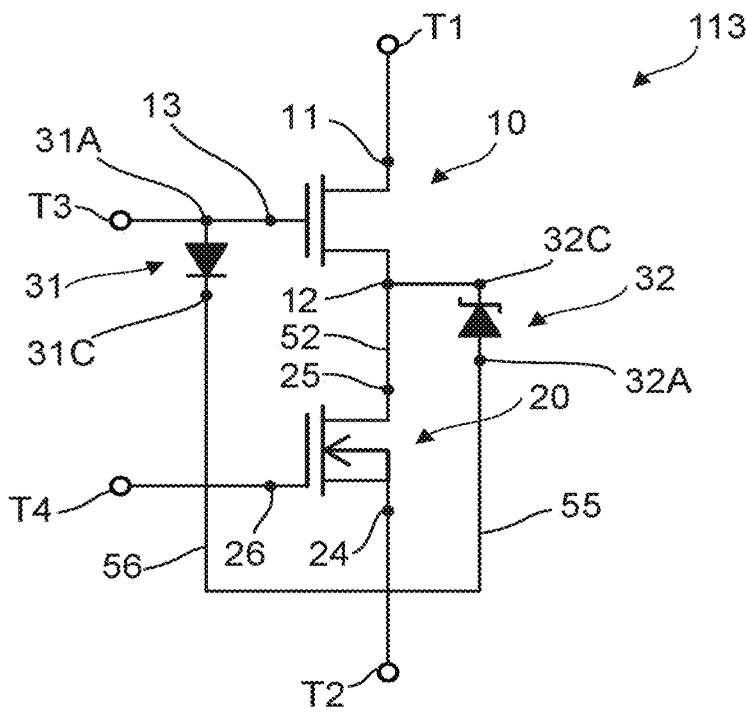
FIG. 11 is an equivalent circuit diagram illustrating the semiconductor device according to the first embodiment.

FIG. 11 is an equivalent circuit diagram illustrating the semiconductor device according to the first embodiment.

FIG. 10A is a line E1-E2 cross-sectional view of FIG. 9. FIG. 10B is a line F1-F2 cross-sectional view of FIG. 9.

As shown in FIG. 9, the semiconductor device 113 according to the embodiment includes a second transistor 20 in addition to the first transistor 10 and the first mounting member 50. In the example, the semiconductor device 113 further includes a first diode 31 and a second diode 32. The configuration of the first transistor 10 of the semiconductor device 113 may be similar to the configuration of the first transistor 10 of the semiconductor device 110.

As shown in FIGS. 9 and 10A, the second transistor 20 includes a fourth element electrode 24, a fifth element electrode 25, and a sixth element electrode 26. As shown in FIGS. 10A and 11, the fifth element electrode 25 is electrically connected to the second frame electrode 52. Thereby, the fifth element electrode 25 is electrically connected to the second element electrode 12.

As shown in FIG. 10A, the second transistor 20 includes a silicon semiconductor layer 20*s*. The second transistor 20 is, for example, a normally-off low breakdown voltage transistor. On the other hand, the first transistor 10 is a normally-on high breakdown voltage transistor. The first transistor 10 and the second transistor 20 have a cascode connection. Thereby, the semiconductor device 113 can have a normally-off operation.

In the second transistor 20, the fourth element electrode 24 is, for example, a source electrode. The fifth element electrode 25 is, for example, a drain electrode. The sixth element electrode 26 is, for example, a gate electrode.

As shown in FIG. 9, the first mounting member 50 includes a fourth frame electrode 54 and a fourth frame connection member 54W. The fourth frame connection member 54W electrically connects the fourth frame electrode 54 and the sixth element electrode 26.

As shown in FIG. 9, the first mounting member 50 includes a fifth pad electrode 65 and a fifth pad connection member 65W. The fifth pad connection member 65W electrically connects the fifth pad electrode 65 and the fourth element electrode 24.

As shown in FIG. 9, the first mounting member 50 includes a fifth frame electrode 55 and a fifth frame connection member 55W. In the example, multiple fifth frame connection members 55W are provided. The multiple fifth frame connection members 55W electrically connect the fifth frame electrode 55 and the fourth element electrode 24.

As shown in FIG. 9, the first mounting member 50 includes a sixth frame electrode 56 and a sixth frame connection member 56W. The sixth frame connection member 56W electrically connects the fifth frame electrode 55 and the sixth frame electrode 56.

As shown in FIG. 11, the first diode 31 includes a first anode 31A and a first cathode 31C. As shown in FIGS. 10B and 11, the second diode 32 includes a second anode 32A and a second cathode 32C. As shown in FIGS. 9 and 11, the first anode 31A is electrically connected to the third element electrode 13. In the example as shown in FIG. 9, the first anode 31A and the third frame electrode 53 are electrically connected by a connection member 53Wa. The first anode 31A is electrically connected to the third element electrode 13 by the connection member 53Wa and the third frame connection member 53W.

As shown in FIG. 11, the first cathode 31C is electrically connected to the second anode 32A. In the example as shown in FIGS. 9 and 10B, the second anode 32A and the fifth frame electrode 55 are electrically connected by a connection member 55Wa. As shown in FIG. 11, the second cathode 32C is electrically connected to the second element electrode 12. In the example as shown in FIG. 10B, the second cathode 32C is electrically connected to the second frame electrode 52. The second cathode 32C is electrically connected to the second element electrode 12 via the second frame electrode 52 and the second frame connection member 52W.

The first diode 31 is, for example, a p-i-n diode. The second diode 32 is, for example, a zener diode (a voltage regulator diode).

In the example as shown in FIG. 9, the fourth pad electrode 64 is electrically connected to the second frame electrode 52 via the fourth pad connection member 64W, the second element electrode 12, and the multiple second frame connection members 52W.

As shown in FIG. 9, the first frame electrode 51 is used as a first terminal T1 (referring to FIG. 11). As shown in FIG. 9, the fifth frame electrode 55 is used as a second terminal T2 (referring to FIG. 11). As shown in FIG. 9, the third frame electrode 53 is used as a third terminal T3 (referring to FIG. 11). As shown in FIG. 9, the fourth frame electrode 54 is used as a fourth terminal T4 (referring to FIG. 11). For example, the first terminal T1 functions as a drain terminal of the semiconductor device 113. For example, the second terminal T2 functions as a source terminal of the semiconductor device 113. For example, the fourth terminal T4 functions as a gate terminal of the semiconductor device 113.

In the semiconductor device 113 as well, the multiple first frame connection members 51W can be inspected with high accuracy by providing at least one of the first pad electrode 61 or the third pad electrode 63. The multiple second frame connection members 52W can be inspected with high accuracy by providing at least one of the second pad electrode 62 or the fourth pad electrode 64.

In the semiconductor device 113, for example, the multiple fifth frame connection members 55W can be inspected with high accuracy by providing the fifth pad electrode 65.

Figure 12:
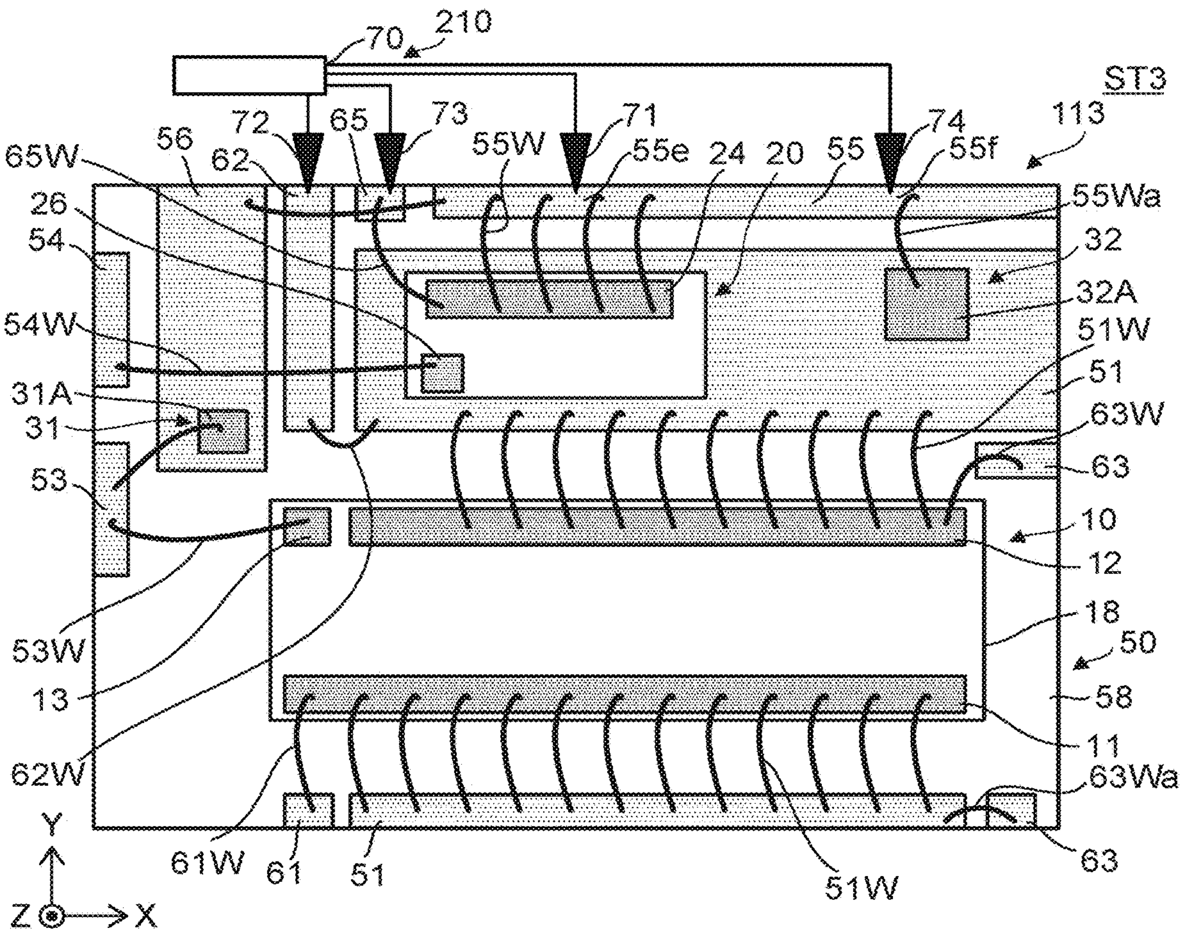
FIG. 12 is a schematic plan view illustrating an inspection state of the semiconductor device according to the first embodiment.

FIG. 12 is a schematic plan view illustrating an inspection state of the semiconductor device according to the first embodiment. As shown in FIG. 12, the inspection apparatus 210 of the semiconductor device includes the first probe 71, the second probe 72, the third probe 73, the fourth probe 74, and the controller 70. The controller 70 is electrically connected to the first, second, third, and fourth probes 71, 72, 73, and 74. The controller 70 is configured to inspect the semiconductor device 113. In addition to the inspections in the first inspection state ST1 and the second inspection state ST2 described above, the controller 70 is configured to inspect the semiconductor device 113 in a third inspection state ST3.

As described above, the first mounting member 50 includes the fifth pad electrode 65, the fifth pad connection member 65W, the fifth frame electrode 55, and the multiple fifth frame connection members 55W. The fifth pad connection member 65W electrically connects the fifth pad electrode 65 and the fourth element electrode 24. The multiple fifth frame connection members 55W electrically connect the fifth frame electrode 55 and the fourth element electrode 24.

In the third inspection state ST3, the first probe 71 is electrically connected to a fifth portion 55*e* of the fifth frame electrode 55, the second probe 72 is electrically connected to the second pad electrode 62, the third probe 73 is electrically connected to the fifth pad electrode 65, and the fourth probe 74 is electrically connected to a sixth portion 55*f* of the fifth frame electrode 55. For example, the fifth portion 55*e* of the fifth frame electrode 55 is between the fifth pad electrode 65 and the sixth portion 55*f* of the fifth frame electrode 55.

The controller 70 is configured to inspect at least a portion of the multiple fifth frame connection members 55W in such a third inspection state ST3 by detecting a potential difference between the third probe 73 and the fourth probe 74 when a current is supplied between the first probe 71 and the second probe 72. The state of the multiple fifth frame connection members 55W to be detected can be detected with high accuracy. The quality is more easily improved because the inspection has high accuracy. High productivity is easily obtained. According to the embodiment, a semiconductor device can be provided in which the quality can be improved.

In the first embodiment, the number of the multiple first frame connection members 51W is, for example, not less than 20 and not more than 100. The number of the multiple first frame connection members 51W may be, for example, not less than 30 and not more than 60. The multiple first frame connection members 51W includes, for example, at least one selected from the group consisting of Au and Cu. The number of the multiple second frame connection members 52W is, for example, not less than 20 and not more than 100. The number of the multiple second frame connection members 52W may be, for example, not less than 30 and not more than 60. The multiple second frame connection members 52W includes, for example, at least one selected from the group consisting of Au and Cu.

For example, the number of the multiple fifth frame connection members 55W is, for example, not less than 5 and not more than 30. The number of the multiple fifth frame connection members 55W may be, for example, not less than 5 and not more than 15. The multiple fifth frame connection members 55W includes, for example, at least one selected from the group consisting of Au and Cu.

Second Embodiment

Figure 13:
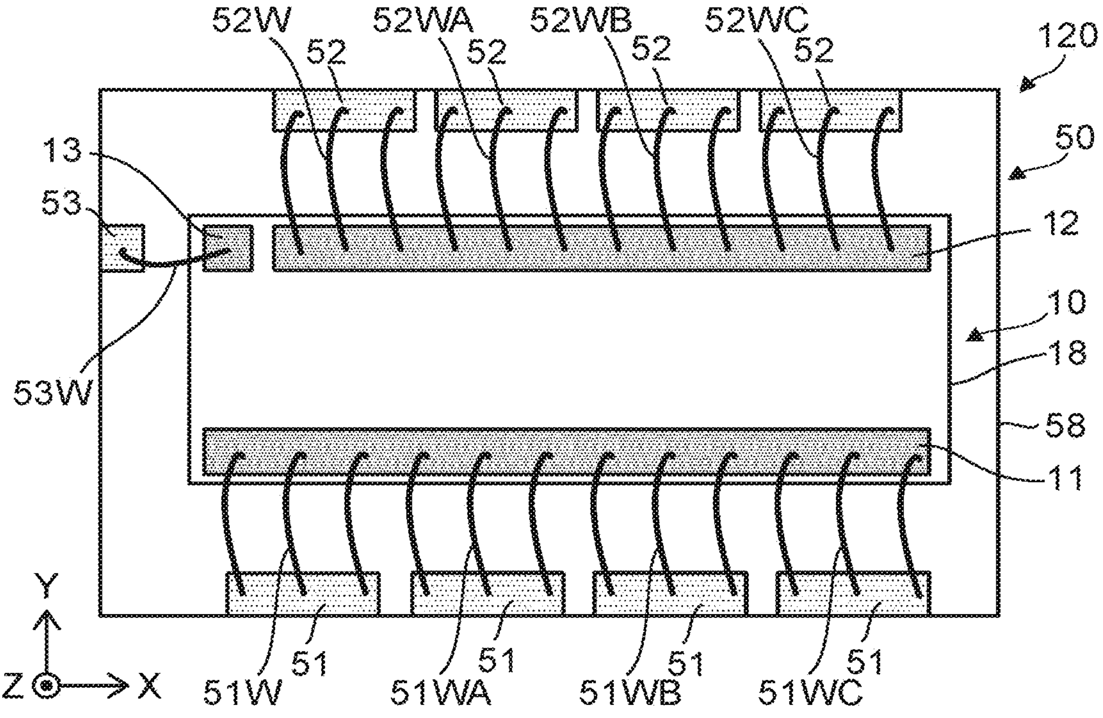
FIG. 13 is a schematic plan view illustrating an inspection state of a semiconductor device according to a second embodiment.

FIG. 13 is a schematic plan view illustrating an inspection state of a semiconductor device according to a second embodiment. As shown in FIG. 13, the semiconductor device 120 according to the second embodiment includes the first transistor 10 and the first mounting member 50. The configuration of the first transistor 10 of the semiconductor device 120 may be similar to the configuration of the first transistor 10 of the semiconductor device 110. For example, the first transistor 10 includes the nitride semiconductor layer 10*s* and includes the first element electrode 11, the second element electrode 12, and the third element electrode 13 (referring to FIG. 1E). An example of the first mounting member 50 of the semiconductor device 120 will now be described.

As shown in FIG. 13, the first mounting member 50 includes the multiple first frame electrodes 51, the multiple first frame connection members 51W, and other multiple first frame connection members 51WA. The multiple first frame connection members 51W electrically connect the first element electrode 11 and one of the multiple first frame electrodes 51. The other multiple first frame connection members 51WA electrically connect the first element electrode 11 and another one of the multiple first frame electrodes 51.

The first mounting member 50 may include other multiple first frame connection members 51WB, other multiple first frame connection members 51WC, etc. The other multiple first frame connection members 51WB electrically connect the first element electrode 11 and another one of the multiple first frame electrodes 51. The other multiple first frame connection members 51WC electrically connect the first element electrode 11 and another one of the multiple first frame electrodes 51.

For example, the one of the multiple first frame electrodes 51 described above is next to the other one of the multiple first frame electrodes 51 described above.

In the semiconductor device 120, for example, the state of the multiple first frame connection members 51W, etc., can be inspected by detecting a current flowing between one of the multiple first frame electrodes 51 and another one of the multiple first frame electrodes 51.

Figure 14A:
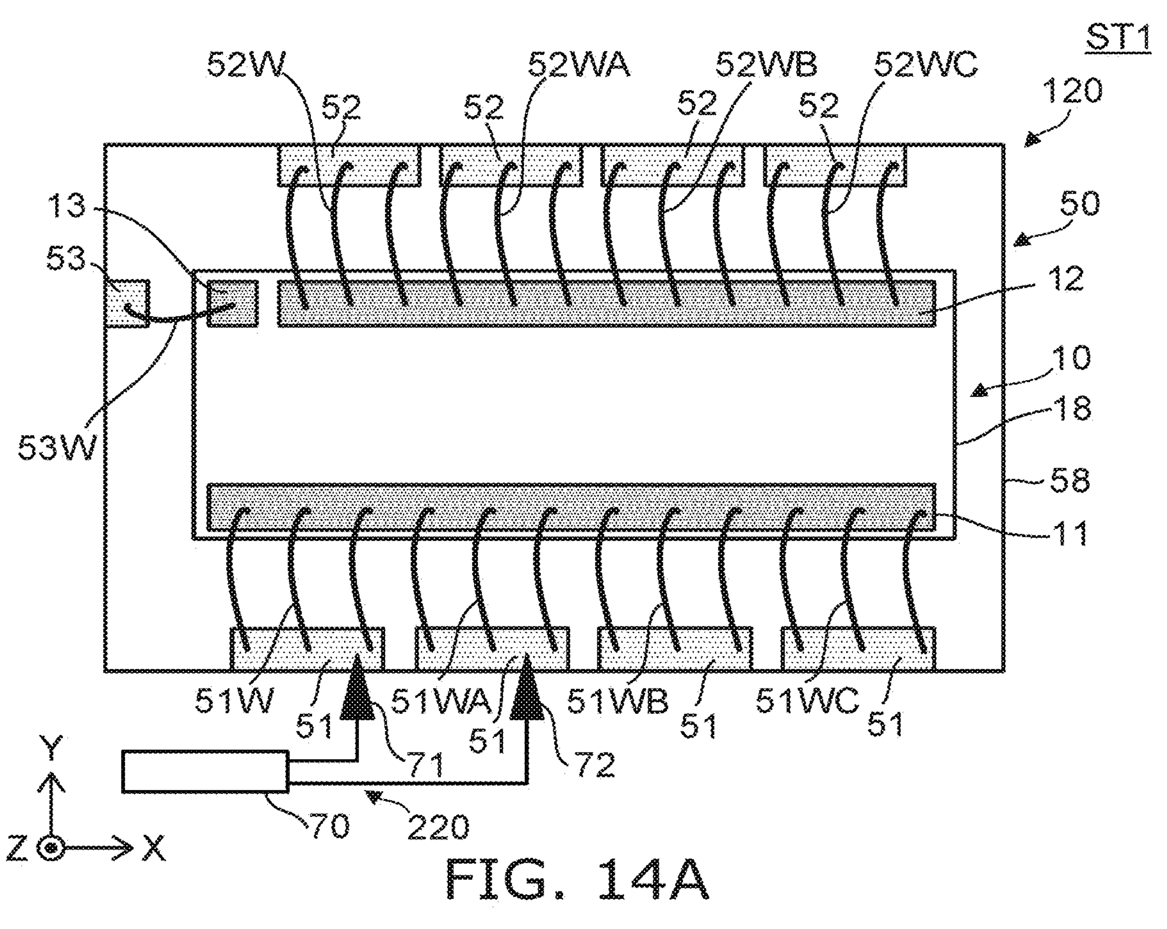
FIGS. 14A and 14B are schematic plan views illustrating inspection states of the semiconductor device according to the second embodiment.
Figure 14B:
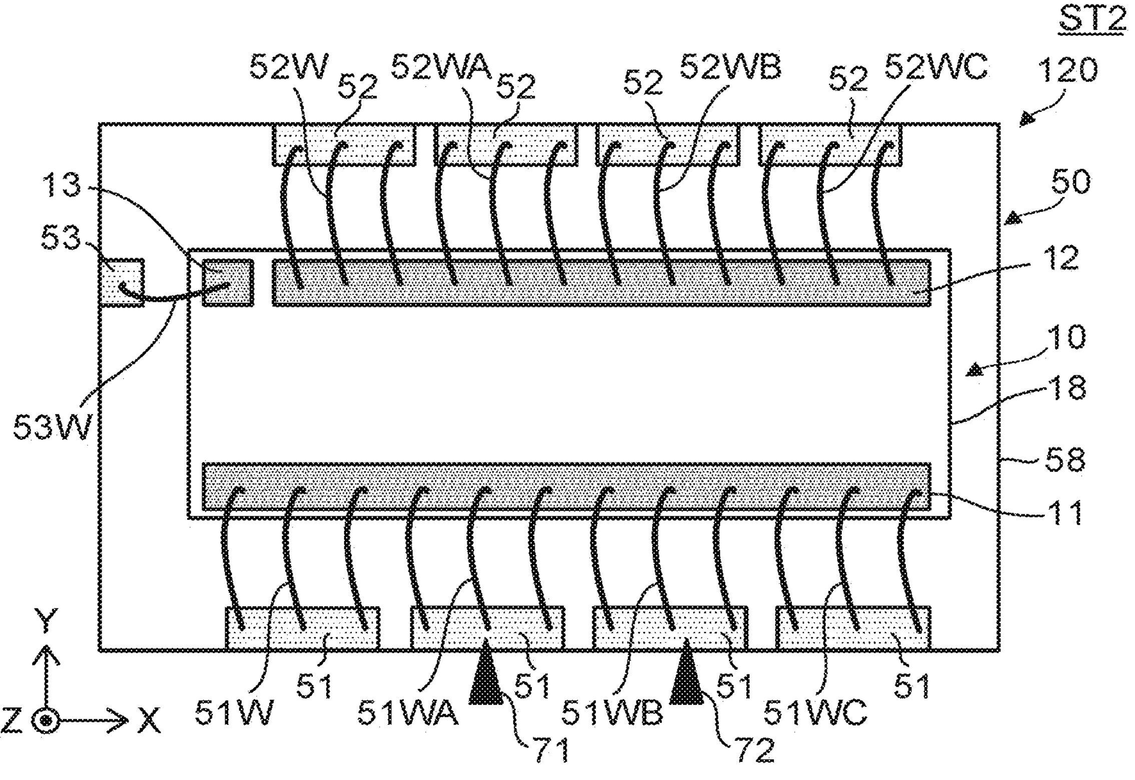

FIGS. 14A and 14B are schematic plan views illustrating inspection states of the semiconductor device according to the second embodiment.

As shown in FIG. 14A, an inspection apparatus 220 includes the first probe 71, the second probe 72, and the controller 70. The controller 70 is electrically connected to the first and second probes 71 and 72. The controller 70 is configured to inspect the semiconductor device 120.

As described above, the semiconductor device 120 includes the first transistor 10 and the first mounting member 50. The first mounting member 50 includes the multiple first frame electrodes 51, the multiple first frame connection members 51W, and the other multiple first frame connection members 51WA.

In the first inspection state ST1 as shown in FIG. 14A, the first probe 71 is electrically connected to the one of the multiple first frame electrodes 51 described above, and the second probe 72 is electrically connected to the other one of the multiple first frame electrodes 51 described above. The multiple first frame connection members 51W are connected to the one of the multiple first frame electrodes 51 described above. The other multiple first frame connection members 51WA are connected to the other one of the multiple first frame electrodes 51 described above. The controller 70 is configured to inspect at least a portion of the multiple first frame connection members 51W (and the other multiple first frame connection members 51WA) in the first inspection state ST1 by detecting a current flowing between the first probe 71 and the second probe 72.

In such a semiconductor device 120 and such an inspection apparatus 220, the state of the multiple first frame connection members (the multiple first frame connection members 51W, the multiple first frame connection members 51WA, etc.) of interest can be inspected without being affected by the other connection members, etc. A semiconductor device and an inspection apparatus of a semiconductor device can be provided in which the quality can be improved.

In the second inspection state ST2 as shown in FIG. 14B, the first probe 71 is electrically connected to the one of the multiple first frame electrodes 51 described above, and the second probe 72 is electrically connected to the other one of the multiple first frame electrodes 51 described above. The multiple first frame connection members 51WA are connected to the one of the multiple first frame electrodes 51 described above. The multiple first frame connection members 51WB are connected to the other one of the multiple first frame electrodes 51 described above. The controller 70 is configured to inspect at least a portion of the multiple first frame connection members 51WA (and the other multiple first frame connection members 51WB) in the first inspection state ST1 by detecting a current flowing between the first probe 71 and the second probe 72.

Such a configuration relating to the multiple first frame electrodes 51 and the multiple first frame connection members 51W is applicable to the multiple second frame electrodes 52 and the multiple second frame connection members 52W. For example, the multiple second frame connection members 52W, multiple second frame connection members 52WA, multiple second frame connection members 52WB, multiple second frame connection members 52WC, etc., may be provided.

In the semiconductor device 120 such as that described above, one first frame electrode 51 can be considered to be divided into multiple regions (the multiple first frame electrodes 51). The distance between the multiple first frame electrodes 51 may be short.

Figure 15:
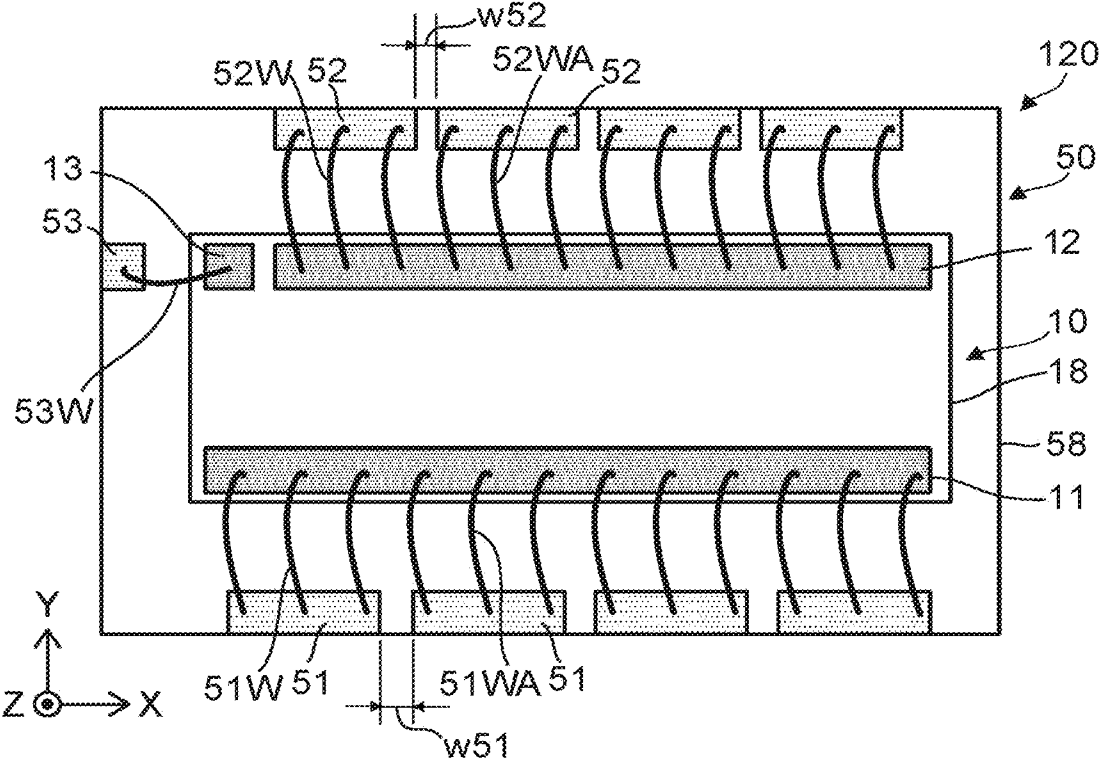
FIG. 15 is a schematic plan view illustrating an inspection state of the semiconductor device according to the second embodiment.

FIG. 15 is a schematic plan view illustrating an inspection state of the semiconductor device according to the second embodiment. As shown in FIG. 15, one of the multiple first frame electrodes 51 is next to another one of the multiple first frame electrodes 51. In such a case, it is favorable for a distance w51 between the one of the multiple first frame electrodes 51 described above and the other one of the multiple first frame electrodes 51 described above to be not less than 10 m and not more than 80 μm.

As shown in FIG. 15, one of the multiple second frame electrodes 52 is next to another one of the multiple second frame electrodes 52. In such a case, it is favorable for a distance w52 between the one of the multiple second frame electrodes 52 described above and the other one of the multiple second frame electrodes 52 described above to be not less than 10 m and not more than 80 μm.

Third Embodiment

A third embodiment relates to the inspection apparatus 210 of the semiconductor device. As described above, the inspection apparatus 210 includes the first to fourth probes 71 to 74 and the controller 70 (referring to FIG. 2). The controller 70 is configured to inspect the semiconductor device 110. In the semiconductor device 110 as shown in FIG. 2, the first mounting member 50 includes the first frame electrode 51, the multiple first frame connection members 51W, the second frame electrode 52, the second frame connection member 52W, the first pad electrode 61, and the first pad connection member 61W.

In the first inspection state ST1 illustrated in FIG. 2, the first probe 71 is electrically connected to the first portion 51*a* of the first frame electrode 51, the second probe 72 is electrically connected to the second frame electrode 52, the third probe 73 is electrically connected to the first pad electrode 61, and the fourth probe 74 is electrically connected to the second portion 51*b* of the first frame electrode 51. As shown in FIG. 2, the controller 70 is configured to inspect at least a portion of the multiple first frame connection members 51W in such a first inspection state ST1 by detecting a potential difference between the third probe 73 and the fourth probe 74 when a current is supplied between the first probe 71 and the second probe 72.

Fourth Embodiment

A fourth embodiment relates to the inspection apparatus 220 of the semiconductor device.

As described above, the inspection apparatus 210 includes the first probe 71, the second probe 72, and the controller 70 (referring to FIG. 14A). The controller 70 is configured to inspect the semiconductor device 120. In the semiconductor device 120, the first mounting member 50 includes the multiple first frame electrodes 51, the multiple first frame connection members 51W, and the other multiple first frame connection members 51WA. The multiple first frame connection members 51W electrically connect the first element electrode 11 and one of the multiple first frame electrodes 51. The other multiple first frame connection members 51WA electrically connect the first element electrode 11 and another one of the multiple first frame electrodes 51.

In the first inspection state ST1 illustrated in FIG. 14A, the first probe 71 is electrically connected to the one of the multiple first frame electrodes 51 described above, and the second probe 72 is electrically connected to the other one of the multiple first frame electrodes 51 described above. As shown in FIG. 14A, the controller 70 is configured to inspect at least a portion of the multiple first frame connection members 51W (and the multiple first frame connection members 51WA) in such a first inspection state ST1 by detecting a current flowing between the first probe 71 and the second probe 72.

Fifth Embodiment

A fifth embodiment relates to a method for inspecting the semiconductor device. For example, the method for inspecting the semiconductor device according to the fifth embodiment is based on the inspection apparatus 210 illustrated in FIG. 2. For example, the first inspection state ST1 illustrated in FIG. 2 is employed in the inspection method. In the first inspection state ST1, the first probe 71 is electrically connected to the first portion 51*a* of the first frame electrode 51, the second probe 72 is electrically connected to the second frame electrode 52, the third probe 73 is electrically connected to the first pad electrode 61, and the fourth probe 74 is electrically connected to the second portion 51*b* of the first frame electrode 51. In the first inspection state ST1, at least a portion of the multiple first frame connection members 51W is inspected by detecting a current flowing between the first probe 71 and the second probe 72. The multiple first frame connection members 51W can be inspected with high accuracy.

The inspection method according to the fifth embodiment may include, for example, the inspection described with reference to FIG. 12. For example, in the third inspection state ST3 illustrated in FIG. 12, the first probe 71 is electrically connected to the fifth portion 55*e* of the fifth frame electrode 55, the second probe 72 is electrically connected to the first pad electrode 61, the third probe 73 is electrically connected to the fifth pad electrode 65, and the fourth probe 74 is electrically connected to the sixth portion 55*f* of the fifth frame electrode 55. At least a portion of the multiple fifth frame connection members 55W is inspected in the third inspection state ST3 by detecting a potential difference between the third probe 73 and the fourth probe 74 when a current is supplied between the first probe 71 and the second probe 72. The multiple fifth frame connection members 55W can be inspected with high accuracy.

Sixth Embodiment

A sixth embodiment relates to a method for inspecting a semiconductor device. For example, the method for inspecting the semiconductor device according to the sixth embodiment is based on the inspection apparatus 220 illustrated in FIG. 14A. As described with reference to FIG. 14A, at least a portion of the multiple first frame connection members 51W (and the other multiple first frame connection members 51WA, etc.) is inspected by detecting a current flowing between the first probe 71 and the second probe 72 in the first inspection state ST1 in which the first probe 71 is electrically connected to one of the multiple first frame electrodes 51 and the second probe 72 is electrically connected to another one of the multiple first frame electrodes 51. The multiple first frame connection members 51W (and the other multiple first frame connection members 51WA, etc.) can be inspected with high accuracy.

In the embodiments, the first transistor 10 may be normally-on or normally-off. The first transistor 10 may have a JFET structure or a MOS structure.

In the embodiments, the element member 18 may include, for example, Si. The element member 18 may include, for example, at least one selected from the group consisting of a Si substrate, a SiC substrate, a sapphire substrate, and a GaN substrate. A conductive layer (e.g., an electrode) may be provided at the back surface (the lower surface) of the element member 18. For example, the conductive layer may be set to a ground potential, etc.

In the embodiments, the state of multiple connection members can be inspected with high accuracy. By performing such an inspection, for example, a semiconductor device can be provided in which the output characteristics are stable. For example, a semiconductor device can be provided in which the nonuniformity of the current density of the semiconductor device is small and the characteristics are stable. For example, the degradation of the element over long-term use does not occur easily, and a highly reliable semiconductor device can be provided.

According to the embodiments, a semiconductor device, an inspection apparatus of a semiconductor device, and a method for inspecting a semiconductor device can be provided in which the quality can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as transistors, mounting members, element electrodes, frame electrodes, pad electrodes, connection members, and includes in inspection apparatuses such as probes, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, inspection apparatuses of semiconductor devices, and methods for inspecting semiconductor devices practicable by an appropriate design modification by one skilled in the art based on the semiconductor devices, the inspection apparatuses of semiconductor devices, and the methods for inspecting semiconductor memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first transistor including a nitride semiconductor layer and including a first element electrode, a second element electrode, and a third element electrode;

a second transistor including a fourth element electrode, a fifth element electrode, and a sixth element electrode; and a first mounting member, the first mounting member including a first frame electrode, a plurality of first frame connection members electrically connecting the first element electrode and the first frame electrode,
a first pad electrode, and
a first pad connection member electrically connecting the first element electrode and the first pad electrode,
the fifth element electrode being electrically connected to the first frame electrode,
the first transistor being normally-on.

2. The semiconductor device according to claim 1, wherein
the first mounting member further includes a mounting substrate,
the mounting substrate includes a first substrate surface facing the first transistor, and
the first frame electrode, the first pad electrode, and the first transistor are located on the first substrate surface.

3. The semiconductor device according to claim 1, wherein
the first mounting member further includes a mounting substrate,
the mounting substrate includes a first substrate surface facing the first transistor,
a first direction is from the mounting substrate toward the first frame electrode, and
a position of the nitride semiconductor layer in the first direction is between a position of the first substrate surface in the first direction and a position of the first element electrode in the first direction, between a position of the first substrate surface in the first direction and a position of the second element electrode in the first direction, and between a position of the first substrate surface in the first direction and a position of the third element electrode in the first direction.

4. The semiconductor device according to claim 1, wherein
the first mounting member further includes:
a second frame electrode;
a plurality of second frame connection members electrically connecting the second element electrode and the second frame electrode;
a second pad electrode; and
a second pad connection member electrically connecting the second element electrode and the second pad electrode.

5. The semiconductor device according to claim 4, wherein
the first mounting member further includes:
a third pad electrode; and
a third pad connection member electrically connecting the third pad electrode and the first frame electrode, and
at least a portion of the first frame electrode is between the first pad electrode and the third pad electrode.

6. The semiconductor device according to claim 5, wherein
the first mounting member further includes:
a fourth pad electrode; and
a fourth pad connection member electrically connecting the fourth pad electrode and the second frame electrode, and
at least a portion of the second frame electrode is between the second pad electrode and the fourth pad electrode.

7. The semiconductor device according to claim 1, wherein
a number of the plurality of first frame connection members is not less than 20 and not more than 100.

8. The semiconductor device according to claim 1, wherein
the plurality of first frame connection members includes at least one selected from the group consisting of Au and Cu.

9. The semiconductor device according to claim 1, further comprising:
a first diode including a first anode and a first cathode; and
a second diode including a second anode and a second cathode,
the first anode being electrically connected to the third element electrode,
the first cathode being electrically connected to the second anode,
the second cathode being electrically connected to the second element electrode.

10. The semiconductor device according to claim 9, wherein
the second transistor includes a silicon semiconductor layer, and
the second transistor is normally-off.

11. The semiconductor device according to claim 9, wherein
the first mounting member further includes:
a fifth pad electrode; and
a fifth pad connection member electrically connecting the fifth pad electrode and the fourth element electrode.

* * * * *